United States Patent
Ryu et al.

(10) Patent No.: US 10,269,955 B2
(45) Date of Patent: Apr. 23, 2019

(54) VERTICAL FET STRUCTURE

(71) Applicant: Cree, Inc., Durham, NC (US)

(72) Inventors: Sei-Hyung Ryu, Cary, NC (US);
Marcelo Schupbach, Raleigh, NC (US); Adam Barkley, Raleigh, NC (US); Scott Allen, Apex, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 15/407,689

(22) Filed: Jan. 17, 2017

(65) Prior Publication Data
US 2018/0204945 A1    Jul. 19, 2018

(51) Int. Cl.
*H01L 29/78* (2006.01)
*H01L 29/16* (2006.01)
*H01L 29/423* (2006.01)
*H01L 29/06* (2006.01)
(Continued)

(52) U.S. Cl.
CPC ...... *H01L 29/7827* (2013.01); *H01L 29/0696* (2013.01); *H01L 29/1095* (2013.01); *H01L 29/1608* (2013.01); *H01L 29/4238* (2013.01); *H01L 29/42376* (2013.01); *H01L 29/7395* (2013.01); *H01L 29/7802* (2013.01)

(58) Field of Classification Search
None
See application file for complete search history.

(56) References Cited

U.S. PATENT DOCUMENTS

| 8,476,702 B2* | 7/2013 | Izumi ............... H01L 29/0696 |
| | | 257/331 |
| 2006/0113664 A1* | 6/2006 | Shiraishi ............. H02M 7/003 |
| | | 257/723 |
| 2009/0166731 A1 | 7/2009 | Maruoka |
| | (Continued) | |

FOREIGN PATENT DOCUMENTS

WO    2016014224 A1    1/2016

OTHER PUBLICATIONS

Verneau, G., et al., "Empirical Power MOSFET Modeling: Practical Characterization and Simulation Implantation," Conference Record of the 2002 IEEE Industry Applications Conference, Oct. 13-18, 2002, Pittsburgh, Pennsylvania, USA, pp. 2425-2432.
(Continued)

*Primary Examiner* — Su C Kim
*Assistant Examiner* — David S Wilbert
(74) *Attorney, Agent, or Firm* — Anthony J. Josephson

(57) ABSTRACT

A vertical FET includes a silicon carbide substrate having a top surface and a bottom surface opposite the top surface; a drain/collector contact on the bottom surface of the silicon carbide substrate; and an epitaxial structure on the top surface of the silicon carbide substrate having formed therein a first source/emitter implant. A gate dielectric is provided on a portion of the epitaxial structure. First source/emitter contact segments are spaced apart from each other and on the first source/emitter implant. A first elongated gate contact and a second elongated gate contact are on the gate dielectric and positioned such that the first source/emitter implant is below and between the first elongated gate contact and the second elongated gate contact. Inter-gate plates extend from at least one of the first elongated gate contact and the second elongated gate contact into spaces formed between the first source/emitter contact segments.

29 Claims, 7 Drawing Sheets

(51) Int. Cl.
*H01L 29/739* (2006.01)
*H01L 29/10* (2006.01)

(56) References Cited

U.S. PATENT DOCUMENTS

2014/0001558 A1* 1/2014 Kueck .................. H01L 29/407
257/368
2017/0110545 A1* 4/2017 Nagao ................. H01L 29/1608

OTHER PUBLICATIONS

International Search Report and Written Opinion for International Patent Application No. PCT/US2018/013987, dated Apr. 12, 2018, 16 pages.

* cited by examiner

VERTICAL FET STRUCTURE

FIELD OF THE DISCLOSURE

The present invention relates to vertical field effect transistor (FET) structures.

BACKGROUND

Silicon carbide (SIC) based metal oxide semiconductor field effect transistors (MOSFETs) offer significant advantages over their silicon (Si) based counterparts in high power applications. However, one advantage that Si-based MOSFETs have over SiC-based MOSFETs is the higher internal gate-source capacitance $C_{GS}$. Having a higher $C_{GS}$ tends to keep the Si-based MOSFETs from erroneously turning on due to transients in drain bias. As such, there is a need for a space-efficient and effective technique for increasing the effective $C_{GS}$ for SiC-based MOSFETs.

SUMMARY

A vertical field effect transistor (FET) structure is disclosed. The vertical FET includes a silicon carbide substrate having a top surface and a bottom surface opposite the top surface; a drain/collector contact on the bottom surface of the silicon carbide substrate; and an epitaxial structure on the top surface of the silicon carbide substrate having formed therein a first source/emitter implant. A gate dielectric is provided on a portion of the epitaxial structure. A first plurality of source/emitter contact segments are spaced apart from each other and on the first source/emitter implant, such that the gate dielectric is not below the first plurality of source/emitter contact segments. A first elongated gate contact and a second elongated gate contact are on the gate dielectric and positioned such that the first source/emitter implant is below and between the first elongated gate contact and the second elongated gate contact. A first plurality of inter-gate plates extend from at least one of the first elongated gate contact and the second elongated gate contact into spaces formed between the first plurality of source/emitter contact segments. Additional internal capacitance is provided where each of the first plurality of inter-gate plates overlaps a portion of the first source/emitter implant and the inter-gate plates are separated by the gate dielectric. The epitaxial structure may be formed from silicon carbide or other appropriate material system.

Each of the first plurality of inter-gate plates may extend completely between the first elongated gate contact and the second elongated gate contact through a space formed between an adjacent pair of the first plurality of source/emitter contact segments. Further, the first elongated gate contact, the second elongated gate contact, and the first plurality of inter-gate plates may be formed from the same material in the same or different planes.

In one embodiment, the vertical FET may include at least a first transistor cell and a second transistor cell, such that the first elongated gate contact forms part of the first transistor cell and the second elongated gate contact forms part of the second transistor cell. The first source/emitter implant may be shared by the first transistor cell and the second transistor cell. The first transistor cell and the second transistor cell may be metal oxide semiconductor field effect transistor (MOSFET) cells, insulated gate bipolar transistor (IGBT) cells, and the like.

The epitaxial structure may further include a first source/emitter well in which the first source/emitter implant is provided. For a MOSFET configuration, the substrate and the source/emitter implant are doped with a material having a first polarity and the first source well is doped with a doping material having a second polarity, which is opposite that of the first polarity. For an IGBT configuration, the substrate and the source/emitter well are doped with a material having a first polarity and the first source/emitter implant is doped with a doping material having a second polarity, which is opposite that of the first polarity.

The vertical FET has a gate-source/emitter capacitance and a gate-drain/collector capacitance wherein, due to the inter-gate plates, a ratio of the gate-source/emitter capacitance to the gate-drain capacitance is greater than 170, 200, 250, 300, 350, or more.

Given the similarities between the source and emitter elements as well as the drain and collector elements of MOSFET and IGBT devices, the adjectives source/emitter and drain/collector are used to describe the corresponding elements for the MOSFET, IGBT, and like devices generally. For example, an elongated drain/collector contact is defined herein to cover both an elongated drain contact and an elongated collector contact. A source/emitter region is defined herein to cover both a source region and an emitter region. A source/emitter well is defined herein to cover both a source well and an emitter well. The source/emitter implant is defined herein to cover both a source implant and an emitter implant, and so on and so forth. A gate-source/emitter capacitance is a capacitance between the gate and either a source or emitter of the device, as the case may be. A gate-drain/collector capacitance is a capacitance between the gate and either a drain or collector of the device, as the case may be.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
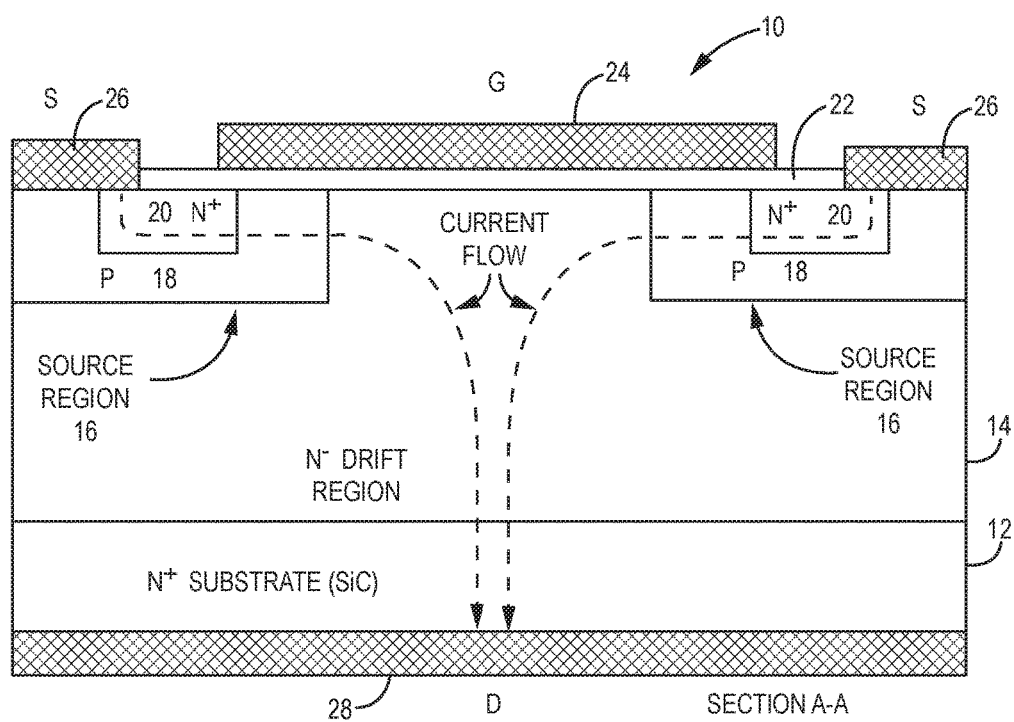
FIG. 1 is a cross-section of a MOSFET cell at a first location according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A vertical FET structure is disclosed herein. The vertical FET structure includes a silicon carbide substrate having a top surface and a bottom surface opposite the top surface; a drain/collector contact on the bottom surface of the silicon carbide substrate; and an epitaxial structure on the top surface of the silicon carbide substrate having formed therein a first source/emitter implant. A gate dielectric is provided on a portion of the epitaxial structure. First source/emitter contact segments are spaced apart from each other and on the first source/emitter implant. A first elongated gate contact and a second elongated gate contact are on the gate dielectric and positioned such that the first source/emitter implant is below and between the first elongated gate contact and the second elongated gate contact. Inter-gate plates extend from at least one of the first elongated gate contact and the second elongated gate contact into spaces formed between the first source/emitter contact segments. Additional internal capacitance is provided where each of the first plurality of inter-gate plates overlap a portion of the first source/emitter implant and are separated by the gate dielectric. The epitaxial structure may be formed from silicon carbide or other appropriate material system. Details are provided below.

With reference to FIG. 1, a cross-section of a cell for a DMOSFET (double-implanted metal oxide semiconductor field effect transistor) is illustrated. The cell is referenced in general as MOSFET cell 10. While the MOSFET cell 10 is used to describe various concepts, these concepts are applicable to virtually any type of vertical FET structure, including insulated gate bipolar transistors (IGBTs) and the like.

In one embodiment, the MOSFET cell 10 is formed in 4H- or 6H-silicon carbide (SiC) using a double ion implantation process. In particular, the MOSFET cell 10 includes a SiC substrate 12, which is heavily doped with an N-type dopant (N+). An SiC epitaxial structure resides over the substrate 12 to provide a drift region 14 wherein two source regions 16 are formed in an upper portion of the epitaxial structure through a double implantation process. While a SiC material system is used for the epitaxial structure and the substrate 12, other material systems, such as gallium nitride (GaN) may benefit from the concepts disclosed herein. The drift region 14 is lightly doped with an N-type dopant (N−). Each source region 16 includes a source well 18, which is moderately doped with a P-type dopant (P), and a source implant 20, which resides within and is biased toward an upper surface of the source well 18. The source implant 20 is heavily doped with an N-type dopant (N+). The source regions 16 are spaced apart from each other and along an upper surface of the epitaxial structure, such that a JFET (junction FET) region is formed therebetween.

A gate dielectric 22 resides on the upper surface of the epitaxial structure. An elongated gate contact 24 resides over the gate dielectric 22. Source contact segments 26 reside over respective portions of the source regions 16. In particular, each source contact segment 26 resides over an outer portion of the corresponding source well 18 and source implant 20. The gate dielectric 22 extends between the source contact segments 26, wherein the elongated gate contact 24 resides over the gate dielectric 22 and between the source contact segments 26. However, the elongated gate contact 24 will not contact the source contact segments 26 and will only extend over inner portions of the source well 18 and source implant 20. As illustrated, the elongated gate contact 24 extends over only a small portion of the source implant 20. An elongated drain contact 28 is provided on a bottom side of the substrate 12.

In operation, high voltages across the elongated drain contact 28 and the source contact segments 26 are supported by the MOSFET cell 10 when a bias below threshold voltage is applied to the elongated gate contact 24. When a positive bias is applied to the elongated gate contact 24, current will flow from the source contact segments 26 to the elongated drain contact 28. As illustrated in FIG. 1 with the dashed lines, current will flow from the source contact segments 26, laterally through the source implant 20 and source well 18, and then vertically through the drift region 14 and substrate 12 to the elongated drain contact 28.

For certain embodiments that are geared toward high-power applications, the substrate 12 may range in thickness from 50 um to 600 um and be doped at concentrations between $1\times10^{18}$ cm$^{-3}$ and $1\times10^{20}$ cm$^{-3}$. The drift region 14 may range in thickness from 3 um to 150 um and be doped at concentrations between $1\times10^{14}$ cm$^{-3}$ and $1\times10^{18}$ cm$^{-3}$. The source well 18 may range in thickness from 0.2 um to 2 um and be doped at concentrations between $1\times10^{15}$ cm$^{-3}$ and $1\times10^{19}$ cm$^{-3}$. The source implant 20 may range in thickness from 0.1 um to 0.5 um and be doped at concentrations between $1\times10^{19}$ cm$^{-3}$ and $5\times10^{21}$ cm$^{-3}$. The gate dielectric 22 may be formed from Silicon Dioxide, Silicon nitride, high-K dielectrics such as Hafnium oxide, and the like. The elongated gate contact 24, source contact segments 26, and elongated drain contact 28 may be formed from polysilicon, metal such as Aluminum, metal silicides, and the like. Exemplary N-type dopants include Nitrogen and Phosphorus. Exemplary P-type dopants include Aluminum and Boron. Further, the doping polarities of the various layers and regions may be reversed or modified depending on the application and desired operation of the MOSFET cell 10.

Figure 2:
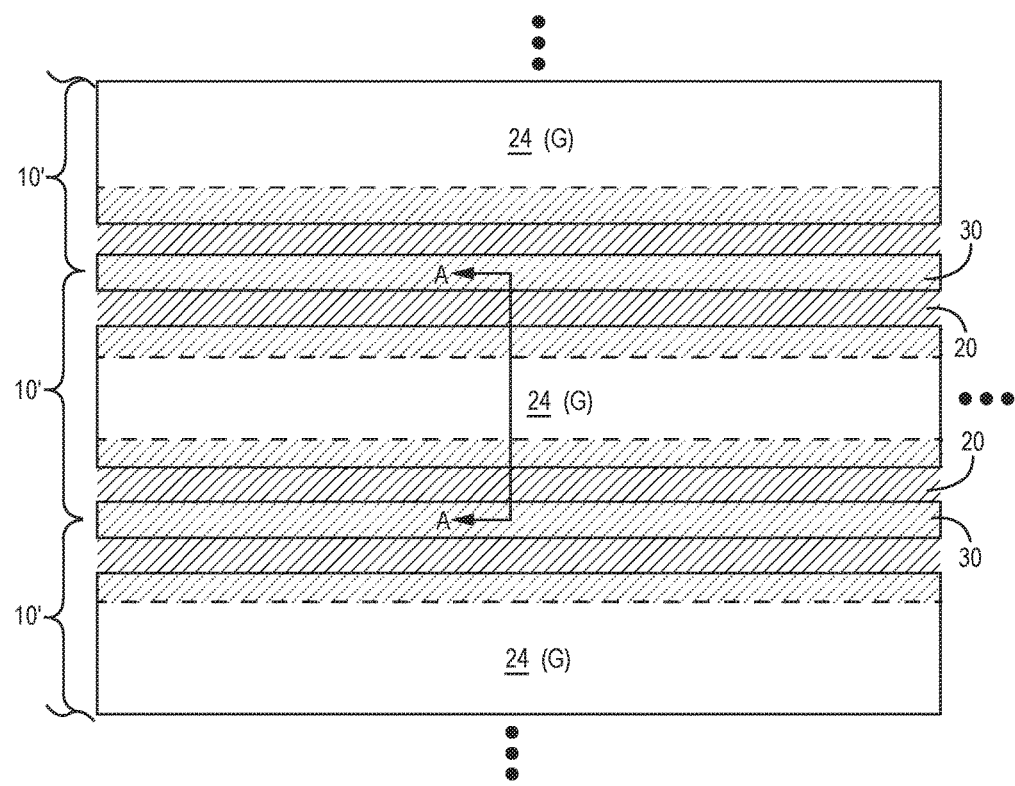
FIG. 2 is a top view of a conventional MOSFET cell.

With reference to FIG. 2, a top view of a conventional layout for a conventional MOSFET cell 10' is illustrated. In particular, FIG. 2 illustrates three conventional MOSFET cells 10' that are elongated left to right. Three elongated gate contacts 24, two elongated source implants 20, and two elongated source contacts 30 are illustrated. For clarity, the gate dielectric 22 is not illustrated. This conventional layout does not employ the source contact segments 26, but instead uses continuous, elongated source contacts 30. Adjacent pairs of elongated gate contacts 24 reside over opposing portions of the source implants 20. The elongated source contacts 30 reside over central portions of the source implants 20, and as noted above, are spaced apart from the elongated gate contact 24.

The following discussion references various metrics, including capacitance and voltage, as measured between any two of the drain, gate, and source of the MOSFET cells 10. These measurements are taken between the corresponding contacts associated with the drain (elongated drain contact 28), gate (elongated gate contact 24), and source (source contact segment 26) of the MOSFET cells 10. For example, a gate-source capacitance $C_{GS}$ is a capacitance measured between the gate (elongated gate contact 24) and the source (source contact segment 26), a gate-drain capacitance $C_{GD}$ is a capacitance measured between the gate (elongated gate contact 24) and the drain (elongated drain contact 28), etc. For IGBT embodiments, these measurements are taken between the corresponding contacts associated with the collector, gate (elongated gate contact 24), and emitter. For example, a gate-emitter capacitance CGE is a capacitance measured between the gate and the emitter, a gate-collector capacitance CGC is a capacitance measured between the gate and the collector, as described further below.

The MOSFET cells 10' have internal capacitances, including a gate-source capacitance $C_{GS}$ and a gate-drain capacitance $C_{GD}$. Charge in the gate-source capacitance $C_{GS}$ determines when the device will turn on and turn off. Charge in the gate-drain capacitance $C_{GD}$ determines the drain-source voltage VDS. Quick changes in the drain bias, which may be caused by fast turn-off transients, tend to send large amounts of charge toward the gate through the gate-drain capacitance $C_{GD}$. The gate drive usually absorbs most of this charge, but not all of the charge. Further, the charge is not absorbed instantaneously. The unabsorbed charge is instantaneously shared to the gate-source capacitance $C_{GS}$. The charge that is shared with the gate-source capacitance $C_{GS}$ increases the gate-source voltage $V_{GS}$. When $V_{GS}$ increases above a threshold voltage, the MOSFET cell 10' will erroneously turn on. Efforts to avoid this phenomenon have focused on adding external capacitance between the gate and source to increase the gate-source capacitance $C_{GS}$ using external capacitors outside of the structure of the MOSFET cells 10'. Unfortunately, these efforts have proven largely ineffective, have increased the size of the module in which the MOSFET cells 10' are incorporated, and increase the part count, which can negatively impact the reliability of the module.

Figure 3:
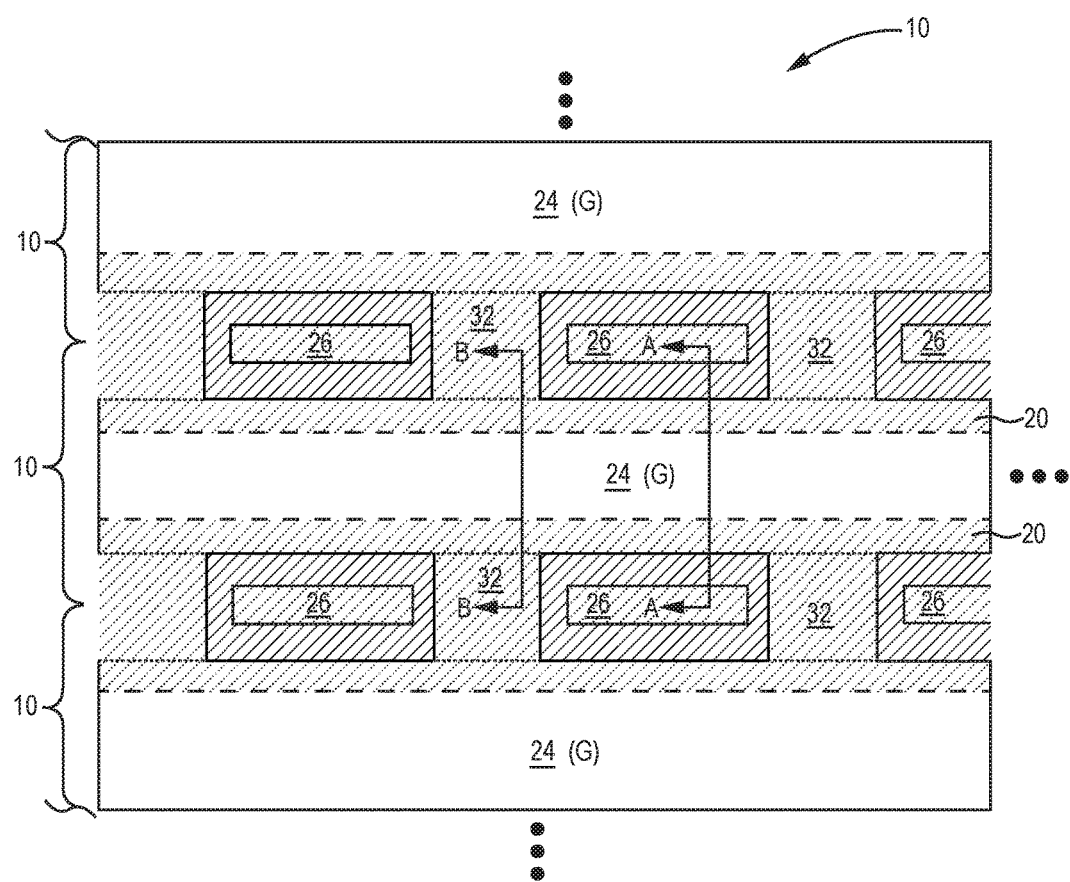
FIG. 3 is a top view of the MOSFET cell of FIG. 1 according to one embodiment of the present disclosure.

Turning now to FIG. 3, a top view of a layout for the MOSFET cells 10 of the present disclosure is illustrated. Instead of an elongated source contact 30, a series of source contact segments 26 are provided over the middle portions of each source implant 20. As a result, open areas are formed over each source implant 20 between adjacent source contact segments 26. In these areas, inter-gate plates 32 are provided. In one embodiment, the inter-gate plates 32 are extensions of the elongated gate contact 24, wherein each inter-gate plate 32 effectively connects adjacent ones of the elongated gate contacts 24. As such, the elongated gate contact 24 and the inter-gate plates 32 may be formed from the same material, in the same plane, and in the same process step. In one embodiment, the elongated gate contact 24 and the inter-gate plates 32 may be formed from polysilicon, metal such as Aluminum, metal silicides, and the like. Alternatively, the inter-gate plates 32 may be formed from different materials in the same or different planes, and in the same or different process steps.

Figure 4:
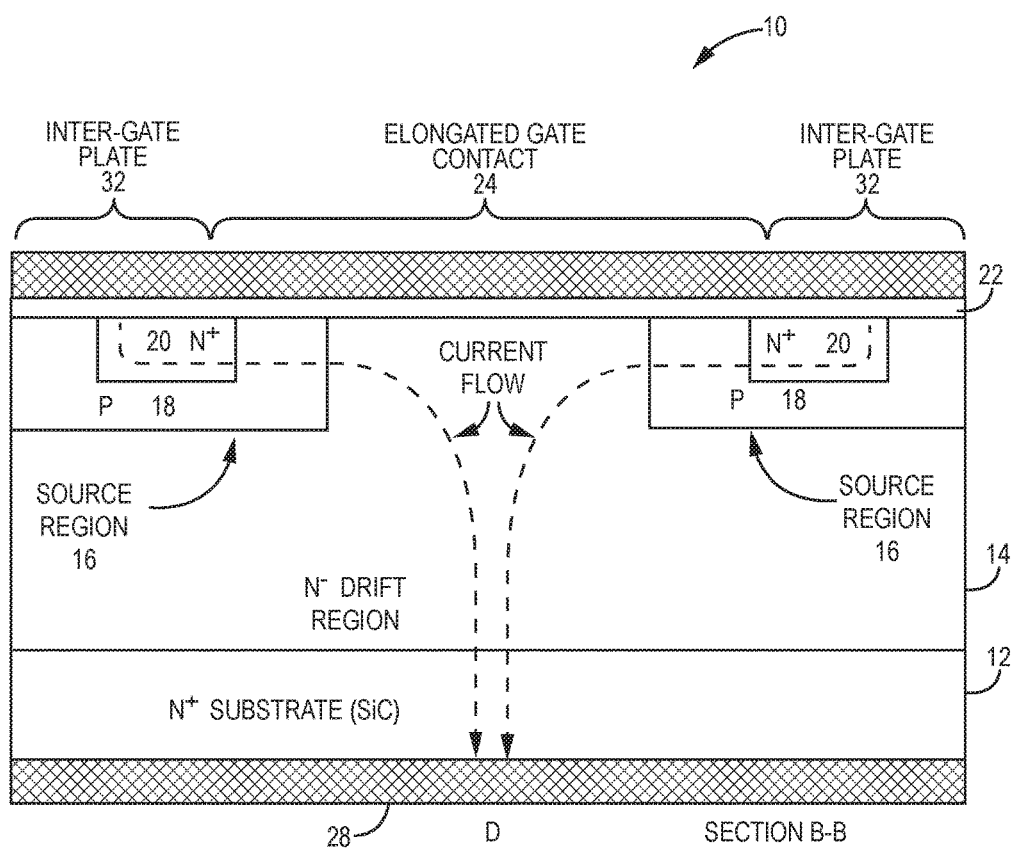
FIG. 4 is a cross-section of the MOSFET cell of FIG. 1 at a second location according to one embodiment of the present disclosure.

FIG. 4 illustrates a cross-section (section B-B of FIG. 3) of the MOSFET cell 10 taken through an inter-gate plate 32, wherein the elongated gate contact 24 and the inter-gate plates 32 are formed from a continuous conductive structure that resides over the gate dielectric 22. For comparison, FIG. 1 corresponds to a cross-section (section A-A of FIG. 3) of the MOSFET cell 10 taken through one of the source contact segments 26.

The addition of the inter-gate plates 32 adds capacitance between the gate and source of the respective MOSFET cells 10. The additional capacitance is formed by:
  presenting the inter-gate plates 32 over the source wells 18 and the source implants 20 of the source regions 16; and
  separating the inter-gate plates 32 from the source wells 18 and the source implants 20 of the source region 16 by the gate dielectric 22.

In essence, each inter-gate plate 32 provides a first capacitive plate, the overlap portion of the source region 16 presents a second capacitive plate, and the gate dielectric 22 provides a dielectric material that separates the first capacitive plate and second capacitive plate to provide additional internal capacitance within the MOSFET cells 10. By employing the inter-gate plates 32 to provide the additional internal capacitance, performance of the MOSFET cells 10 is greatly enhanced with little or no increase in size of the modular circuitry in which the MOSFET cells 10 are employed. In particular, increasing the gate-source capacitance $C_{GS}$ from within the MOSFET cells 10 in this manner helps to suppress erroneous turn-on events during high speed turn-offs without increasing the effective on-resistance of the MOSFET cells 10.

The inter-gate plates 32 need not extend completely between the elongated gate contact 24 of adjacent MOSFET cells 10. For example, the inter-gate plates 32 may simply be like tabs that extend from an elongated gate contact 24 into the area between the source contact segments 26. Further, the inter-gate plates 32 may not be rectangular, but may take on various shapes, sizes, and contours based on the device geometry and performance goals. Similarly, the source region 16, the source wells 18, and source implants 20 may take on varying patterns and shapes, and thus, need not be the simple elongated troughs that are depicted in FIG. 4. Any of these entities may be any combination of continuous elongated troughs, ladder shapes, and the like. Further, these entities may be elongated, yet discontinuous, depending on the application.

Figure 5:
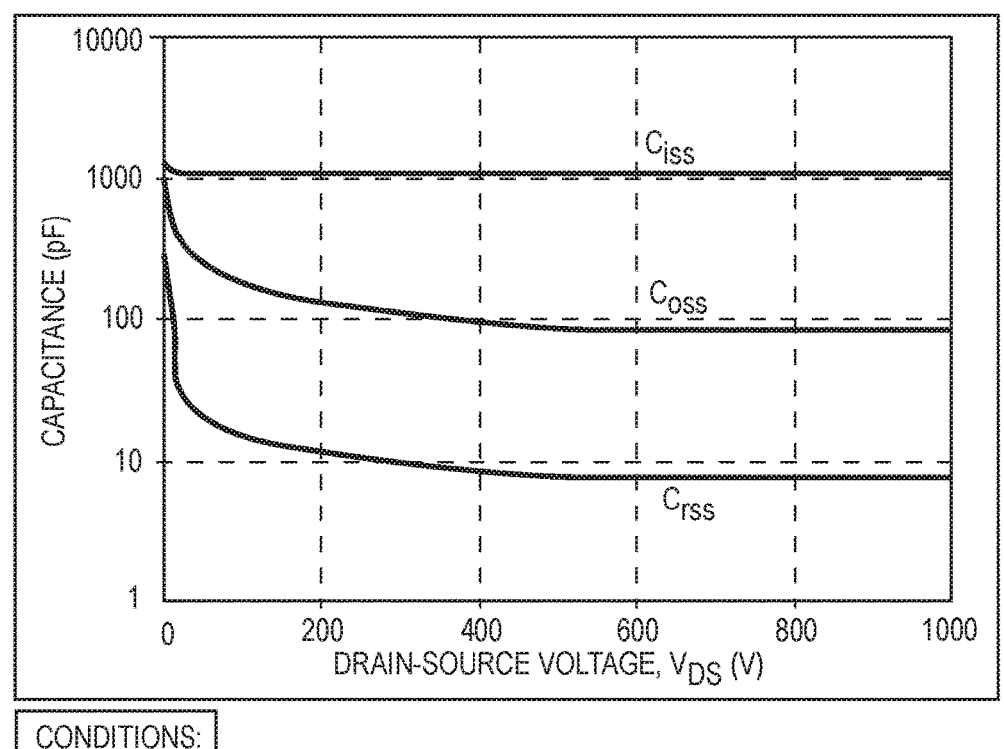
FIGS. 5 and 6 are graphs that plot capacitance versus drain-source voltage for a conventional MOSFET cell and the MOSFET cell of FIG. 1.
Figure 6:
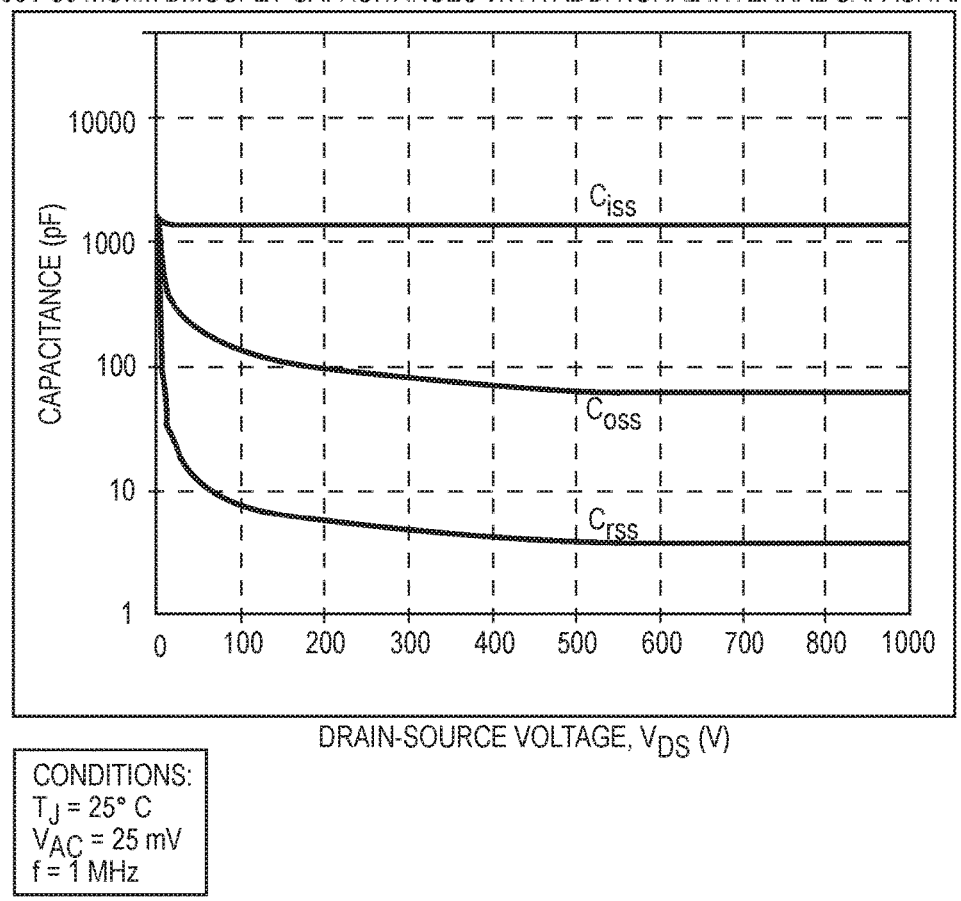

The graphs of FIGS. 5 and 6 compare various capacitances of SiC transistor devices that implement MOSFET cells 10 without and with the inter-gate plates 32, respectively. Specifically, each graph plots $C_{iss}$, $C_{oss}$, and $C_{rss}$ in pico-Farads versus drain-source voltage VDS for a power silicon carbide MOSFET device that is rated to block 1200 V, pass 20 A, and have an on-state resistance (Rds-on) of 80 milli-Ohms. $C_{iss}$ equates to the sum of the gate-source capacitance $C_{GS}$ and the gate-drain capacitance $C_{GD}$ ($C_{iss}=C_{GS}+C_{GD}$). $C_{rss}$ equates to the gate-drain capacitance $C_{GD}$. $C_{oss}$ equates to the sum of the drain-source capacitance CDS and the gate-drain capacitance $C_{GD}$ ($C_{oss}=CDS+C_{GD}$). $C_{rss}$ equates to the gate-drain capacitance $C_{GD}$. From these measurements, one can derive a $C_{GS}$-to-$C_{GD}$ ratio ($C_{GS}/C_{GD}$).

In particular, $C_{GS}=C_{iss}-C_{GD}$, wherein $C_{iss}=C_{GS}$ plus $C_{GD}$. Between 900 and 1,000 volts, $C_{GS}$-to-$C_{GD}$ ratio is approximately 124 for a conventional device that does not include the inter-gate plates 32. The $C_{GS}$-to-$C_{GD}$ ratio for a similar device that does include the inter-gate plates 32 is 385, which is more than a three times improvement over the conventional device that does not include the inter-gate plates 32. While silicon-based devices can achieve $C_{GS}$-to-$C_{GD}$ ratios in this range, silicon carbide-based devices could not prior to the implementation of the inter-gate plates 32 of the present disclosure. With the concepts disclosed herein, silicon carbide-based devices can achieve $C_{GS}$-to-$C_{GD}$ ratios that compete with silicon-based devices while enjoying all of the additional benefits that silicon carbide-based devices provide over their silicon-based counterparts. Depending on the embodiment, $C_{GS}$-to-$C_{GD}$ ratios greater than 150, 175, 200, 250, 300, 350, and even 400 are now possible for silicon carbide-based MOSFET cells 10 (without requiring external capacitances). These ranges may be bounded by $C_{GS}$-to-$C_{GD}$ ratios of 500, 750, and 1000 in different embodiments.

Figure 7:
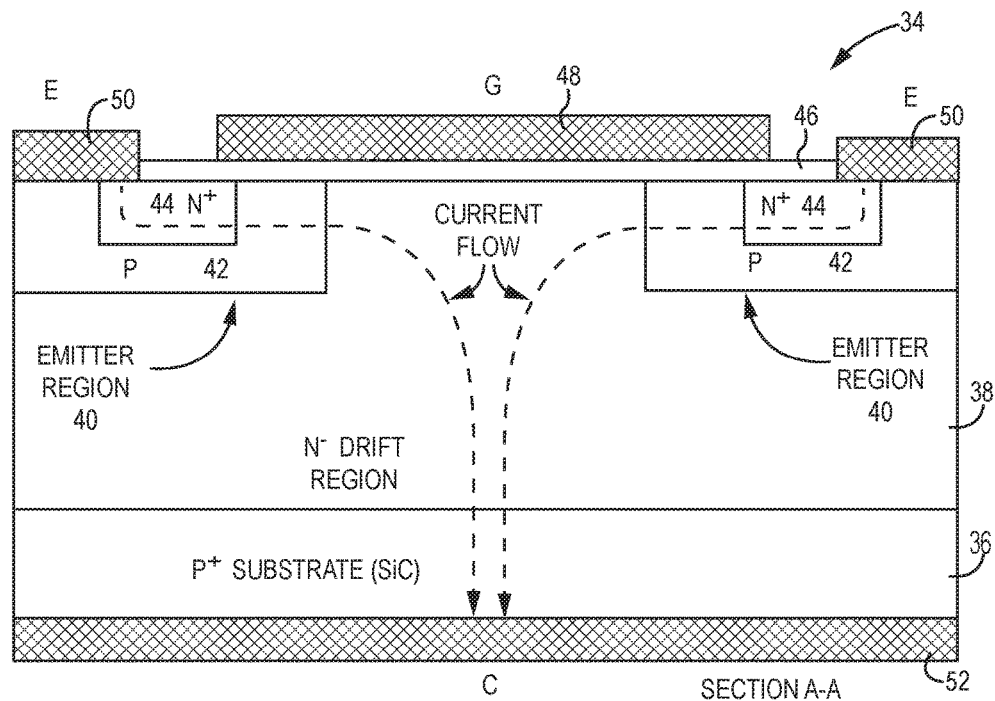
FIG. 7 is a cross-section of an IGBT cell at a first location according to one embodiment of the present disclosure.

As noted above, these concepts not only apply to MOSFET cells 10, but can apply to any vertical FET device, such as an IGBT. FIG. 7 illustrates a cross-section of an exemplary IGBT cell 34. In one embodiment, the IGBT cell 34 is formed in 4H- or 6H-silicon carbide (SiC) using a double ion implantation process. In particular, the IGBT cell 34 includes a SiC substrate 36, which is heavily doped with a P-type dopant (P+), which represents the primary difference between the IGBT cell 34 and the MOSFET cell 10. In the MOSFET cell 10, the substrate 36 is heavily doped with an N-type dopant. An epitaxial structure resides over the substrate 36 to provide a drift region 38 wherein two emitter regions 40, which are analogous to the source regions 16 of the MOSFET cell 10, are formed in an upper portion of the epitaxial structure through a double implantation process. The drift region 38 is lightly doped with an N-type dopant (N−). Each emitter region 40 includes an emitter well 42, which is moderately doped with a P-type dopant (P), and an emitter implant 44, which resides within and is biased toward an upper surface of the emitter well 42. The emitter implant 44 is heavily doped with an N-type dopant (N+). The emitter regions 40 are spaced apart from each other and along an upper surface of the epitaxial structure, such that a JFET (junction FET) region is formed therebetween.

A gate dielectric 46 resides on the upper surface of the epitaxial structure. An elongated gate contact 48 resides over the gate dielectric 46. Emitter contact segments 50 reside over respective portions of the emitter regions 40. In particular, each emitter contact segment 50 resides over an outer portion of the corresponding emitter well 42 and emitter implant 44. The gate dielectric 46 extends between the emitter contact segments 50, wherein the elongated gate contact 48 resides over the gate dielectric 46 and between the emitter contact segments 50. However, the elongated gate contact 48 will not contact the emitter contact segments 50 and will only extend over inner portions of the emitter well 42 and emitter implant 44. As illustrated, the elongated gate contact 48 extends over only a small portion of the emitter implant 44. An elongated collector contact 52 is provided on a bottom side of the substrate 36.

For certain embodiments that are geared toward high-power applications, the substrate 36 may range in thickness from 1 um to 400 um and be doped at concentrations between $1\times10^{18}$ cm$^{-3}$ and $1\times10^{21}$ cm$^{-3}$. The drift region 38 may range in thickness from 10 um to 250 um and be doped at concentrations between $1\times10^{13}$ cm$^{-3}$ and $5\times10^{16}$ cm$^{-3}$. The emitter well 42 may range in thickness from 0.2 um to 2 um and be doped at concentrations between $1\times10^{15}$ cm$^{-3}$ and $1\times10^{19}$ cm$^{-3}$. The emitter implant 44 may range in thickness from 0.1 um to 0.5 um and be doped at concentrations between $1\times10^{19}$ cm$^{-3}$ and $5\times10^{21}$ cm$^{-3}$. The gate dielectric 46 may be formed from Silicon Dioxide, Silicon Nitride, High-K dielectrics such as Hafnium Oxide, and the like. The elongated gate contact 48, emitter contact segments 50, and elongated collector contact 52 may be formed from polysilicon, metal such as Aluminum, metal silicides, and the like. Again, the doping polarities of the various layers and regions may be reversed or modified depending on the application and desired operation of the IGBT cell 34.

Figure 8:
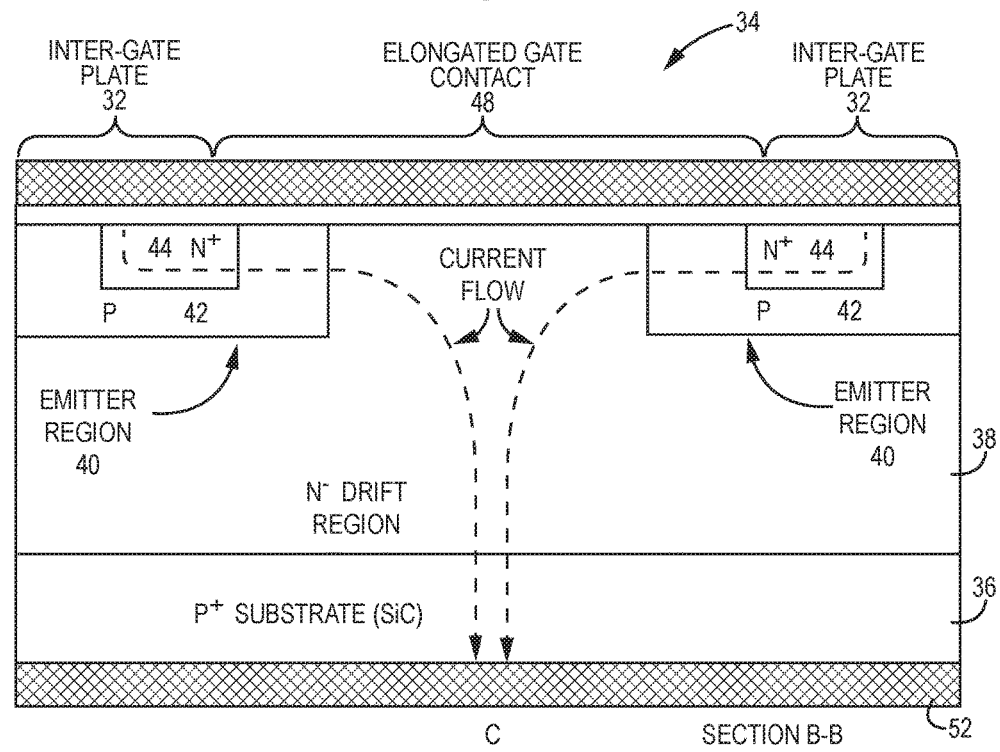
FIG. 8 is a cross-section of the IGBT cell of FIG. 7 at a second location according to one embodiment of the present disclosure.

The top view of a device implementing IGBT cells 34 is identical to that illustrated in FIG. 3, wherein the source implant 20 corresponds to the emitter implant 44 and the source contact segments 26 corresponds to the emitter contact segments 50. As such, FIG. 7 corresponds to the cross-section A-A of FIG. 3, and FIG. 8 corresponds to the cross-section B-B of FIG. 3. The inter-gate plate 32 for the IGBT cell 34 is illustrated in FIG. 8, wherein the inter-gate plate 32 is an extension of the elongated gate contacts 48.

Given the similarities between the source and emitter elements as well as the drain and collector elements of MOSFET and IGBT devices, the adjectives source/emitter and drain/collector are used to describe the corresponding elements for the MOSFET, IGBT, and like devices generally. For example, an elongated drain/collector contact is defined herein to cover both an elongated drain contact and an elongated collector contact. A source/emitter region is defined herein to cover both a source region and an emitter region. A source/emitter well is defined herein to cover both a source well and an emitter well. The source/emitter implant is defined herein to cover both a source implant and an emitter implant, and so on and so forth. A gate-source/emitter capacitance is a capacitance between the gate and either a source or emitter of the device, as the case may be. A gate-drain/collector capacitance is a capacitance between the gate and either a drain or collector of the device, as the case may be.

Those skilled in the art will recognize improvements and modifications to the preferred embodiments of the present disclosure. All such improvements and modifications are considered within the scope of the concepts disclosed herein and the claims that follow.

What is claimed is:

1. A vertical field effect transistor (FET) structure comprising:
    a silicon carbide substrate having a top surface and a bottom surface opposite the top surface;
    a drain/collector contact on the bottom surface of the silicon carbide substrate;
    an epitaxial structure on the top surface of the silicon carbide substrate and having formed therein a first source/emitter implant;
    a gate dielectric on a portion of the epitaxial structure;
    a first plurality of source/emitter contact segments spaced apart from each other and on a continuous portion of the first source/emitter implant such that the gate dielectric is not below the first plurality of source/emitter contact segments;
    a first elongated gate contact and a second elongated gate contact on the gate dielectric and positioned such that the first source/emitter implant is below and between the first elongated gate contact and the second elongated gate contact; and
    a first plurality of inter-gate plates that extend from at least one of the first elongated gate contact and the second elongated gate contact into spaces formed between the first plurality of source/emitter contact segments.

2. The vertical FET structure of claim 1 further including at least a first transistor cell and a second transistor cell such that the first elongated gate contact forms part of the first transistor cell and the second elongated gate contact forms part of the second transistor cell, wherein additional internal capacitance is provided where each of the first plurality of inter-gate plates overlaps a portion of the first source/emitter implant and the first plurality of inter-gate plates are separated by the gate dielectric.

3. The vertical FET structure of claim 2 wherein the first source/emitter implant is shared by the first transistor cell and the second transistor cell.

4. The vertical FET structure of claim 3 wherein the first transistor cell and the second transistor cell are metal oxide semiconductor field effect transistor (MOSFET) cells.

5. The vertical FET structure of claim 3 wherein the first transistor cell and the second transistor cell are insulated gate bipolar transistor (IGBT) cells.

6. The vertical FET structure of claim 1 wherein the epitaxial structure further includes a first source/emitter well in which the first source/emitter implant is provided.

7. The vertical FET structure of claim 6 wherein the silicon carbide substrate and the first source/emitter implant are doped with a material having a first polarity, and the first source/emitter well is doped with a material having a second polarity, which is opposite that of the first polarity.

8. The vertical FET structure of claim 6 wherein the silicon carbide substrate and the first source/emitter well are doped with a material having a first polarity and the first source/emitter implant is doped with a material having a second polarity, which is opposite that of the first polarity.

9. The vertical FET structure of claim 1 wherein each of the first plurality of inter-gate plates extends completely between the first elongated gate contact and the second elongated gate contact through a space formed between an adjacent pair of the first plurality of source/emitter contact segments.

10. The vertical FET structure of claim 1 wherein the first elongated gate contact, the second elongated gate contact, and the first plurality of inter-gate plates are formed from a same material.

11. The vertical FET structure of claim 1 wherein the first elongated gate contact, the second elongated gate contact, and the first plurality of inter-gate plates are formed from a same material and on a common plane.

12. The vertical FET structure of claim 1 wherein the epitaxial structure is formed from silicon carbide.

13. The vertical FET structure of claim 1 wherein a portion of the first elongated gate contact overlaps a first portion of the first source/emitter implant, and a portion of the second elongated gate contact overlaps a second portion of the first source/emitter implant.

14. The vertical FET structure of claim 1 further comprising a gate-source/emitter capacitance and a gate-drain/collector capacitance, wherein a ratio of the gate-source/emitter capacitance to the gate-drain/collector capacitance is greater than 170.

15. The vertical FET structure of claim 1 further comprising a gate-source/emitter capacitance and a gate-drain/collector capacitance, wherein a ratio of the gate-source/emitter capacitance to the gate-drain/collector capacitance is greater than 250.

16. The vertical FET structure of claim 1 further comprising a gate-source/emitter capacitance and a gate-drain/collector capacitance, wherein a ratio of the gate-source/emitter capacitance to the gate-drain/collector capacitance is greater than 350.

17. The vertical FET structure of claim 1 further comprising a gate-source/emitter capacitance and a gate-drain/collector capacitance, wherein a ratio of the gate-source/emitter capacitance to the gate-drain/collector capacitance is between 200 and 750.

18. The vertical FET structure of claim 1 further comprising a gate-source/emitter capacitance and a gate-drain/collector capacitance, wherein a ratio of the gate-source/emitter capacitance to the gate-drain/collector capacitance is between 300 and 1,000.

19. The vertical FET structure of claim 1 wherein the epitaxial structure further includes a second source/emitter implant that is spaced apart from the first source/emitter implant and further comprising:
    a second plurality of source/emitter contact segments spaced apart from each other and on the second source/emitter implant, such that the gate dielectric is not below the second plurality of source/emitter contact segments;
    a third elongated gate contact on the gate dielectric and positioned such that the second source/emitter implant is below and between the first elongated gate contact and the third elongated gate contact; and a second plurality of inter-gate plates that extend from at least one of the first elongated gate contact and the third elongated gate contact into spaces formed between the second plurality of source/emitter contact segments, wherein additional internal capacitance is provided where each of the second plurality of inter-gate plates overlaps a portion of the second source/emitter implant and the first plurality of inter-gate plates are separated by the gate dielectric.

20. The vertical FET structure of claim 19 wherein:

each of the first plurality of inter-gate plates extends completely between the first elongated gate contact and the second elongated gate contact through a space formed between an adjacent pair of the first plurality of source/emitter contact segments; and each of the second plurality of inter-gate plates extends completely between the first elongated gate contact and the third elongated gate contact through a space formed between an adjacent pair of the second plurality of source/emitter contact segments.

21. The vertical FET structure of claim 19 wherein the first elongated gate contact, the second elongated gate contact, and the first plurality of inter-gate plates are formed from a same material.

22. The vertical FET structure of claim 19 wherein the first elongated gate contact, the second elongated gate contact, and the first plurality of inter-gate plates are formed from a same material and on a common plane.

23. The vertical FET structure of claim 22 wherein the epitaxial structure is formed from silicon carbide.

24. The vertical FET structure of claim 19 further comprising a gate-source/emitter capacitance and a gate-drain/collector capacitance, wherein a ratio of the gate-source/emitter capacitance to the gate-drain/collector capacitance is between 200 and 750.

25. The vertical FET structure of claim 19 further comprising a gate-source/emitter capacitance and a gate-drain/collector capacitance, wherein a ratio of the gate-source/emitter capacitance to the gate-drain/collector capacitance is greater than 350.

26. A metal oxide semiconductor field effect transistor (MOSFET) structure comprising:

a silicon carbide substrate having a top surface and a bottom surface opposite the top surface;

a drain contact on the bottom surface;

a silicon carbide epitaxial structure on the top surface of the silicon carbide substrate and having formed therein a source/emitter implant;

a source contact having a plurality of source contact segments spaced apart from each other on the source/emitter implant and a gate contact on the silicon carbide epitaxial structure, wherein a ratio of a gate-source capacitance, as measured between the gate contact and the source contact, to a gate-drain capacitance, as measured between the gate contact and the drain contact, is greater than 250.

27. The MOSFET structure of claim 26 wherein the ratio of the gate-source capacitance to the gate-drain capacitance is greater than 350.

28. The MOSFET structure of claim 26 wherein the ratio of the gate-source capacitance to the gate-drain capacitance is between 250 and 750.

29. The MOSFET structure of claim 26 wherein the ratio of the gate-source capacitance to the gate-drain capacitance is between 300 and 1,000.

* * * * *

UNITED STATES PATENT AND TRADEMARK OFFICE
CERTIFICATE OF CORRECTION

PATENT NO. : 10,269,955 B2
APPLICATION NO. : 15/407689
DATED : April 23, 2019
INVENTOR(S) : Sei-Hyung Ryu et al.

Page 1 of 1

It is certified that error appears in the above-identified patent and that said Letters Patent is hereby corrected as shown below:

In the Claims

In Column 12, Claim 26, Lines 17 and 18, replace "other on the source/emitter" with --other on a continuous portion of the source/emitter--.

Signed and Sealed this
Eighteenth Day of June, 2019

Andrei Iancu
*Director of the United States Patent and Trademark Office*